United States Patent [19]

Oppenberg

[11] Patent Number: 5,003,273

[45] Date of Patent: Mar. 26, 1991

[54] MULTILAYER PRINTED CIRCUIT BOARD WITH PSEUDO-COAXIAL TRANSMISSION LINES

[75] Inventor: George A. Oppenberg, Brooklyn, N.Y.

[73] Assignee: ITT Corporation, New York, N.Y.

[21] Appl. No.: 445,806

[22] Filed: Dec. 4, 1989

[51] Int. Cl.$^5$ ............................................... H01P 3/18
[52] U.S. Cl. .................................. 333/1; 174/117 FF; 333/243
[58] Field of Search ........................... 333/1, 238, 243; 174/36, 117 FF

[56] References Cited

U.S. PATENT DOCUMENTS

| | | | |
|---|---|---|---|
| 3,612,744 | 10/1971 | Thomas | 333/238 X |
| 4,047,132 | 9/1977 | Krajewski | 333/238 |
| 4,673,904 | 6/1987 | Landis | 333/238 |
| 4,776,087 | 10/1988 | Cronin et al. | 333/243 X |
| 4,845,311 | 7/1989 | Schreiber et al. | 333/1 X |

Primary Examiner—Paul Gensler
Attorney, Agent, or Firm—Arthur L. Plevy; Patrick M. Hogan

[57] ABSTRACT

A multilayer printed circuit board has a plurality of planar layers formed with signal conductor lines and return lines grouped around the conductor lines to form pseudo-coaxial transmission lines. The return lines are grouped symmetrically around each signal line, e.g. two, four, or eight return lines at circumferential positions around each signal line. Ground and power planes may be formed with the multilayer structure for shielding and/or for powering electronic components mounted on the structure. The multilayer techniques can also be used to form a multilayer extender card which minimizes crosstalk and is reduced in cost and assembly time as compared to conventional extender boards.

15 Claims, 2 Drawing Sheets

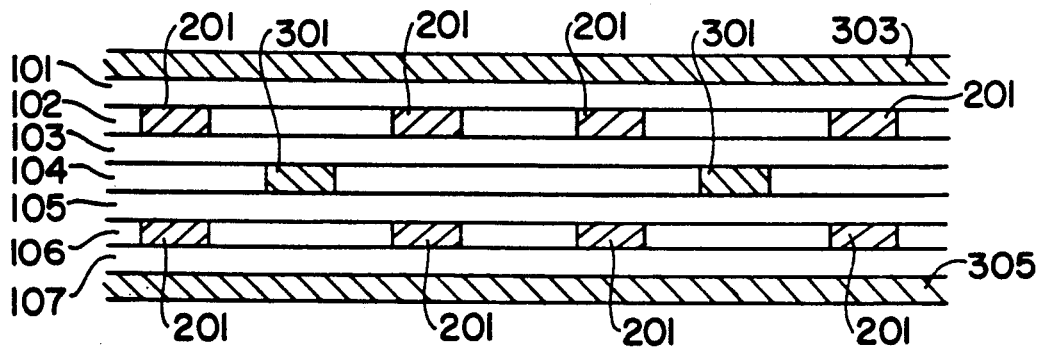
F I G. 1
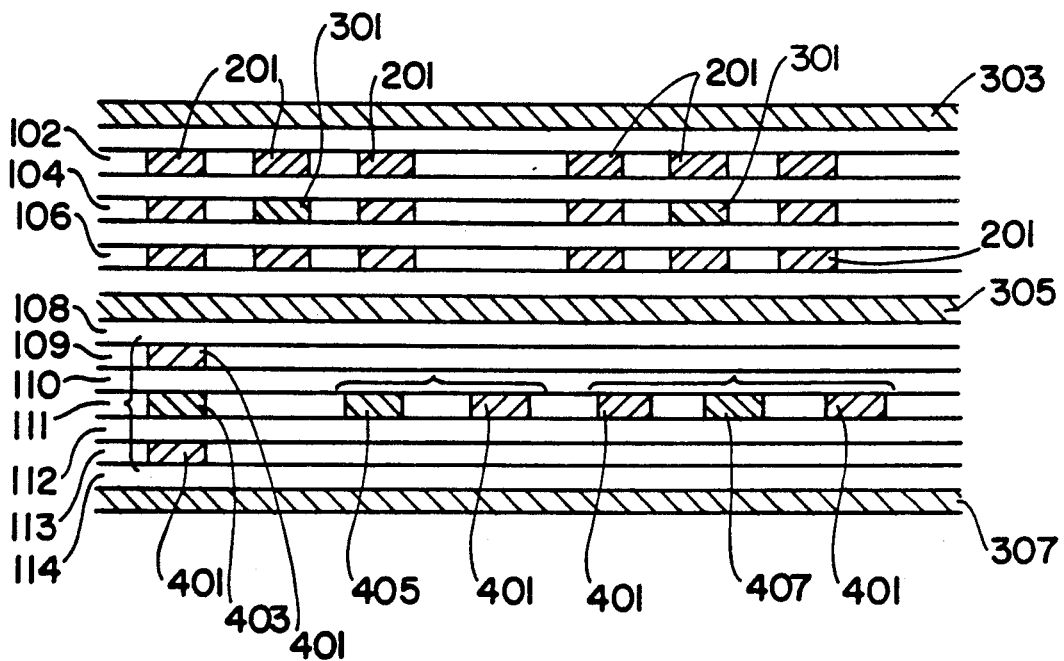
F I G. 2

MULTILAYER PRINTED CIRCUIT BOARD WITH PSEUDO-COAXIAL TRANSMISSION LINES

FIELD OF INVENTION

The present invention relates to transmission lines fabricated on printed circuit boards. More specifically, it relates to the design and fabrication of transmission lines on multilayer printed circuit boards suitable for high-speed wide-bandwidth systems.

BACKGROUND OF INVENTION

Printed circuit boards (PCBs) are employed as a foundation for the mounting of various electronic components making up a circuit or system. Among the characteristics needed for good printed circuit board operation is the ability to electrically connect the various components efficiently and reliably. This is typically done through the use of etched patterns of metal conductors on the surface of the printed circuit boards.

However, the development of complex electronic systems has increased requirements for high packaging densities and high-speed wide bandwidth operation. High-speed logic families such as FAST, ECL, and GaAs (gallium arsenide) circuits have made the design of transmission lines on PCBs a critical factor for signal transition times below one nanosecond. PCB layout is now very critical to maintaining signal integrity, such as preserving signal edges and reducing distortion due to reflections and crosstalk. Proper impedance control and impedance termination are required in order to achieve desired signal fidelity.

Typical printed circuit boards are not suitable for such high frequencies due to excessive signal radiation from the conductive tracks. These conductive tracks, or signal traces, ultimately radiate more energy than they transmit when the frequency exceeds about 500 MHz or go high in the GHz band. Thus, there is a need to develop printed circuit boards which are compatible with such high frequencies.

Another type of equipment which has signal traces for transmission of signals at high frequencies are known as extender cards. These cards are designed to be connected to printed circuit boards and to carry all, or substantially all, of the signals from one printed circuit board to another. As with PCBs, it has been common to employ etched conductors on the surface of the extender cards as signal conductors.

Due to the large number of signals which sometimes have to be handled by an extender card, innovations in this technology have involved the use of signal carrier tape rather than printed circuit boards as the foundation for the conductors. One type of carrier tape is referred to as "flex tape", and is commercially available in many forms. In this approach, one or more layers of flexible tape are each provided with a pattern of conductive tracks. In applications where there is need for more tracks than will fit on a single layer of flex tape, the use of multiple layers has been adopted. This, however, has the disadvantage of requiring each layer to be independently etched, and the layers must then be properly combined in alignment so that the proper connections can be made to the conductive tracks. For high-speed systems, it is also important to control the impedance and provide proper isolation and shielding to preserve signal integrity. Current flex tape-based extender cards usually have an appreciable line length that has undesirable inductance for high-speed logic signals.

SUMMARY OF INVENTION

Accordingly, it is a principal object of the invention to provide a printed circuit board which is particularly designed for use in high-speed wide bandwidth systems. It is a specific object to design and fabricate signal traces on a printed circuit board having the desirable impedance and low distortion characteristics for high-speed signal transmission lines. It is a further object to provide a multilayer extender card for fast risetime signals which is easier to manufacture and lower in cost than conventional flex tape-based extender cards.

In accordance with the invention, a multilayer printed circuit board comprises a plurality of planar layers made of dielectric material formed one on top of the other having signal conductor lines made of conductive material formed at spaced positions therein and return lines made of conductive material formed at spaced positions in parallel with and in spaced relation around associated ones of said conductor lines so as to form pseudo-coaxial transmission lines therewith.

In preferred embodiments of the invention, the return lines are grouped symmetrically around each signal conductor line. Transmission lines having two, four, and eight return lines at circumferential positions around the signal line showed suitable performance characteristics. Ground planes may be placed on both sides of the multilayer structure for shielding, and power and ground planes may be placed in the center of the multilayer structure. The same techniques can also be used to form a multilayer extender card which minimizes crosstalk and is reduced in cost and assembly time as compared to conventional extender boards.

BRIEF DESCRIPTION OF DRAWINGS

The above objects and further features and advantages of the invention are described in detail below in conjunction with the drawings, of which:

FIG. 1 is a schematic cross-sectional diagram of a printed circuit board with pseudo-coaxial transmission lines in accordance with the invention;

FIG. 2 is a schematic cross-sectional diagram of another embodiment of the printed circuit board of the invention;

DETAILED DESCRIPTION OF INVENTION

Figure 3:
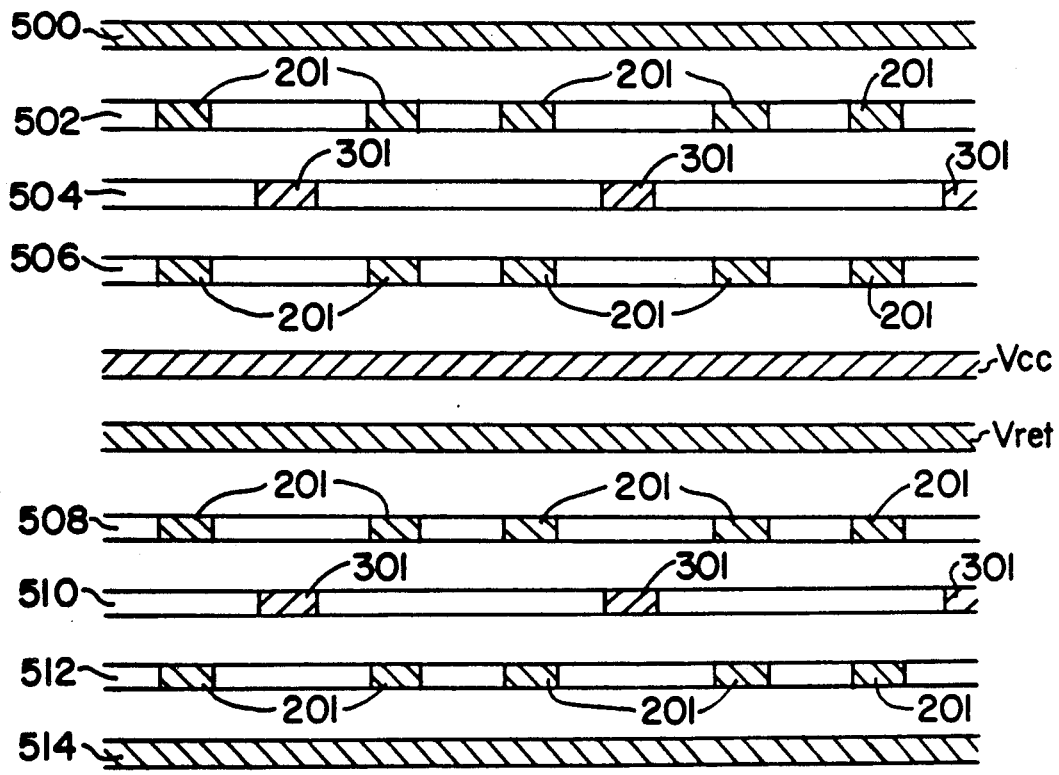
FIG. 3 is a schematic cross-sectional diagram of an extender card in accordance with the invention.

Referring to FIG. 1, one embodiment of a printed circuit board in accordance with the invention is shown in cross-section formed with a plurality of planar layers 101-107 made of dielectric material formed one on top of the other. Layer 104 has signal conductor lines 301 made of conductive material formed at spaced positions in the layer. Layers 102 and 106 above and below layer 104 have return lines 201 made of conductive material formed in parallel with the signal conductor lines 301 and grouped at spaced positions around the conductor lines 301. Four return lines 201 are positioned circumferentially around each of the conductor lines 301 (indicated in heavy black line). The return lines 201 are grounded and form pseudo-coaxial transmission lines with the signal conductor lines 301.

Planar layers 303 and 305 made of conductive material may also be provided with the multilayer printed circuit board (PCB) either as ground planes on both sides, for increased shielding, or, alternatively, one layer may be a power plane and the other a ground plane. Electronic components may be mounted on the conductive planes for grounding and/or power. Additional layers 101, 103, 105 and 107 made of dielectric material may be interposed between the layers containing conductive material to insulate them from each other.

The multilayer PCB structure may be fabricated by forming each layer 101-107 consecutively of dielectric material. Layer 101 may be formed with conductive traces 201 provided thereon and buffered by overcoating with layer 102. The conductive traces are preferably formed by the conventional technique of forming a layer of conductive material followed by masking and etching to define the conductive traces. Layer 102 may overlie the conductive traces 301 or may simply be a planarizing layer having a surface substantially coincident with the surfaces of traces 201. Layer 103 is formed thereover and has conductive traces 301 etched thereon. As with layer 102, layer 104 is provided next and may either overlie conductive traces 301 or may simply bring the layer of dielectric material up equal to the surface of traces 301. Layers 105 and 106 are similarly formed with conductive traces 201, and dielectric layer 107 is provided to complete the enclosure of the conductive traces. Conductive planes 303 and 305 may then be electro-deposited on the surfaces of layers 101 and 107, respectively.

The provision of ground lines 201 physically surrounding the signal conductor lines 301 simulates a coaxial transmission shielding structure. In this configuration, the impedance of the transmission lines is controlled, and signal integrity can be preserved. The pseudo-coaxial grounded lines 201 isolate and shield the signal conductor lines 301 so as to eliminate substantially all detrimental cross-talk between adjacent signal traces.

In FIG. 2, another embodiment of the multilayer PCB is shown in cross-section having each signal conductor line 301 in layer 104 surrounded by eight grounded lines 201 in layers 102 and 106, rather than four as in FIG. 1. The eight return lines 201 are positioned around each of the signal conductor lines 301 to form a pseudo-coaxial transmission line for signals carried on the conductor lines 301. This arrangement avoids the problems of the prior attempts to implement coaxial conductors in printed circuit boards by enclosing the center conductor in a continuous outer shell or conductor.

A second set of layers 108-114 is illustrated in FIG. 2 on the lower side of the ground plane 305. Three different clusters of signal and return lines are shown as examples of other possible transmission line arrangements which do not necessarily simulate pseudo-coaxial effects. Signal line 403 has grounded lines 401 aligned above and below it. Signal line 405 is arranged side-by-side with return line 401. Signal line 407 is positioned between grounded lines 401 on each side in the horizontal direction. These examples illustrate that the number and position of the grounded traces associated with any given signal trace is dependent on the transmission requirements. Fewer or more ground traces may be provided with any given signal trace as appropriate for the frequency and bandwidth of signals being carried on the signal trace.

FIG. 2 also illustrates the use of a third conductive plane 307 along with conductive planes 303 and 305.

The multiple conductive planes allow the use of alternating or oppositely biased power planes 303 and 307 and ground plane 305, which is particularly advantageous where the PCB is to be populated with electronic components on both sides. In this manner, for example, components provided on layer 307 may be powered independently from components mounted on layer 303 on the opposite side of the board. This configuration may also permit the use of different power levels for components on different sides of the board.

In one implementation, a 12-layer printed circuit board was designed for use in high-speed wide bandwidth systems. The board was formed measuring 10×15 inches with different configurations of pseudo-coaxial transmission lines, such as shown in FIG. 2. The signal traces 301 had widths of 5-15 mils, the shielding traces 201 had widths of 5-25 mils, and the spacing between the layers of conductive traces was 5 mils.

Electrical tests were performed on the multilayer printed circuit board to measure impedance, crosstalk, and line capacitance. Impedance measurements showed a range of about 65 to 120 ohms, which was within the desired performance range. Higher impedances in the 100 to 150 ohm range are sometimes desirable due to amplifier/driver output current limitations. Crosstalk (adjacent line pickup) measurements were suitably low, except for the line configurations 405/401 and 407/401 at the lower side of FIG. 2. Generally, the crosstalk increased if the current or voltage in the signal trace increased and if the impedance of the receptor line increased. Line capacitance measurements showed a suitable range of 1.6 to 3.9 pF/inch. Tests for signal integrity (pulse fidelity) showed that all line configurations were free of ringing, reflections, and distortion.

In summary, the use of proper terminated transmission lines of proper spacing and shielding can facilitate transmission of high speed signals in the multilayer PCB. Logic pulses with rise times of less than one nanosecond can be transmitted a distance of as much as 57 inches in a multilayer PCB, while maintaining good pulse fidelity and minimizing crosstalk. For longer line lengths exceeding the rated maximum, impedance-controlled lines with proper termination are required for reliable data transmission.

The above-described multilayer techniques can also be applied to extender cards to carry a large number of signal lines. The conventional extender card is in effect an assembly of two or three printed circuit boards interconnected by flexible tape assemblies. By providing a multilayer extender card with two or more rows of pseudo-coaxial transmission lines, signal integrity can be preserved and the cost and assembly time of the flexible tape connection can be eliminated.

Referring to FIG. 3, the design of the extender card is based upon the use of the multilayer techniques to maintain impedance control for the transmission of signals. Conductors 301 of suitable etch width are each surrounded by four shielding lines 201 of controlled etch width and spacing to simulate a pseudo-coaxial transmission line. In order to shield the lines effectively from the outside environment, shield planes 500, 514 enclose the board. In order to shield the next layer of lines, the power (Vcc) and ground (Vret) planes are put in the center of the board. Ideally, the spacing of the pseudo-coaxial lines from these planes should be as large as possible to obtain a low line capacitance, e.g. a minimum of 10 mils. For use with a standard connector, the overall thickness of the board was kept to about 0.088 inch maximum.

In one implementation, an extender card was formed as a multilayer printed wiring board measuring 7×8 inches. The signal traces 301 had a width of 15 mils, the shielding traces 201 had a width of 10 mils, and the spacing between the layers of conductive traces was 5 mils. The traces were connected at their ends to a 3-row, 168-pin connector, e.g. as used in the ALQ-172 Pavemint system. Twelve pins of this connector were used for ground return and six pins for power distribution. The remaining 150 pins were used for signal transmission via two rows of signal traces 301 in layers 504 and 510 and their associated shielding traces 201 in layers 502, 506 and 508, 512.

Electrical tests were performed on the new extender card and a conventional flex-tape/Teflon type extender board for comparison. Crosstalk (adjacent line pickup) on the new extender card was measured to be approximately 50 mV or 1% of the exciting signal, as compared to 320 mV or 6.4% for the conventional board. Tests for signal integrity (pulse fidelity) showed that the multilayer extender card of the invention maintained comparable signal integrity. The fabrication costs of the new extender board were significantly less than that of assembling two or three flex-tape/Teflon type boards. The thickness, width, and spacing of the conductive traces and their spacing from the ground and power planes can be varied to match the type of signal transmission and to control the desired characteristic impedance and line capacitance.

The specific embodiments of the invention described herein are intended to be illustrative only, and many other variations and modifications may be made thereto in accordance with the principles of the invention. All such embodiments and variations and modifications thereof are considered to be within the scope of the invention, as defined in the following claims.

What is claimed is:

1. A multilayer printed circuit board comprising:
a plurality of planar layers made of dielectric material extending in parallel with each other in lateral and depthwise directions, said planar layers being formed one on top of the other in a vertical direction, at least one of said planar layers having signal conductor lines made of conductive material formed at spaced positions from each other in the lateral direction and extending in parallel with each other in the depthwise direction, and other ones of said planar layers above and below said at least one of said planar layers having return lines made of conductive material formed at spaced positions from each other in the lateral direction and extending in parallel with each other in the depthwise direction,
wherein said return lines are grouped around associated ones of said signal conductor lines so as to form pseudo-coaxial transmission lines therewith; and
wherein said return lines are formed within said other ones of said planar layers spaced from each other and from the associated signal conductor line so as to be insulatively separated therefrom by said dielectric material of said planar layers.

2. A multilayer printed circuit board according to claim 1, wherein the return lines are grouped in position symmetrically around each signal conductor line.

3. A multilayer printed circuit board according to claim 2, including at least four return lines for each signal conductor line, wherein the signal conductor lines are formed in one layer, and the at least four return lines are formed with two return lines in side positions in each of an upper and a lower layer above and below said one layer, respectively.

4. A multilayer printed circuit board according to claim 3, including eight return lines for each signal conductor line, with three return lines in center and side positions in each of said upper and lower layers, and two return lines in said one layer on each side of said signal conductor line.

5. A multilayer printed circuit board according to claim 1, including at least one plane made of conductive material formed with said plurality of layers.

6. A multilayer printed circuit board according to claim 1, including a plane made of conductive material formed on each external side of said plurality of layers.

7. A multilayer printed circuit board according to claim 1, wherein said signal conductor lines and return lines are formed in two or more horizontal rows one on top of the other.

8. A multilayer printed circuit broad according to claim 1, wherein said at least one planar layer having said signal conductor lines further includes return lines formed at spaced positions from and extending in parallel with associated ones of said signal conductor lines.

9. A multilayer printed circuit board comprising:
a plurality of planar layers made of dielectric material extending in parallel with each other in lateral and depthwise directions, said planar layers being formed one on top of the other in a vertical direction, at least one of said planar layers having signal conductor lines made of conductive material formed at spaced positions from each other in the lateral direction and extending in parallel with each other in the depthwise direction, and other ones of said planar layers above and below said at least one of said planar layers having return lines made of conductive material formed at spaced positions from each other in the lateral direction and extending in parallel with each other in the depthwise direction,
wherein said return lines are grouped around associated ones of said signal conductor lines so as to form pseudo-coaxial transmission lines therewith; and
intermediate insulating layers made of dielectric material extending in parallel with said planar layers in the lateral and depthwise directions, each of which is interposed between adjacent ones of said planar layers containing said signal conductor lines and said return lines so as to insulatively separate said lines from each other.

10. A multilayer printed circuit board comprising:
a plurality of planar layers made of dielectric material formed one on top of the other in a vertical direction having signal conductor lines made of conductive material formed at spaced positions and return lines made of conductive material formed at spaced positions in parallel with and in spaced relation around associated ones of said signal conductor lines so as to form pseudo-coaxial transmission lines therewith; and
an external plane made of conductive material formed on each external side in the vertical direction of said plurality of planar layers, wherein at least one of said external planes is a power plane connected to a power source for supplying power to electronic components to be mounted on said power plane.

11. A multilayer printed circuit board comprising:
a plurality of planar layers made of dielectric material formed one on top of the other having signal conductor lines made of conductive material formed at spaced positions and return lines made of conductive material formed at spaced positions in parallel with and in spaced relation around associated ones of said signal conductor lines so as to form pseudo-coaxial transmission lines therewith; and
at least one internal plane made of conductive material formed in a central position within said plurality of planar layers.

12. A multilayer printed circuit board according to claim 11, including a power plane and a return plane made of conductive material in parallel in the central position of said plurality of layers.

13. A multilayer printed circuit board according to claim 12, wherein said signal conductor lines and return lines are formed in two or more horizontal rows positioned above and below said power and return planes.

14. A multilayer printed circuit board according to claim 11, further including an external ground plane made of conductive material formed on each external side of said plurality of planar layers.

15. A multilayer printed circuit board according to claim 11, wherein said signal conductor lines and return lines have their ends connected to connector pins of a connector.

* * * * *